United States Patent
Son et al.

(10) Patent No.: US 12,480,197 B2
(45) Date of Patent: Nov. 25, 2025

(54) METHOD FOR MANUFACTURING MASK AND DEPOSITION APPARATUS INCLUDING MASK

(71) Applicant: Samsung Display Co., Ltd., Yongin-si (KR)

(72) Inventors: Ji-Hee Son, Hwaseong-si (KR);
Youngmin Moon, Yongin-si (KR);
Jaeuoon Kim, Hwaseong-si (KR);
Seungyong Song, Suwon-si (KR);
Sungsoon Im, Suwon-si (KR);
Jong-Hyun Choung, Suwon-si (KR);
Hyunmin Cho, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 205 days.

(21) Appl. No.: 17/478,083

(22) Filed: Sep. 17, 2021

(65) Prior Publication Data
US 2022/0178016 A1 Jun. 9, 2022

(30) Foreign Application Priority Data
Dec. 8, 2020 (KR) .................. 10-2020-0170132

(51) Int. Cl.
*C23C 14/04* (2006.01)
*C23C 16/04* (2006.01)
*H10K 71/16* (2023.01)

(52) U.S. Cl.
CPC .......... *C23C 14/042* (2013.01); *C23C 16/042* (2013.01); *H10K 71/166* (2023.02)

(58) Field of Classification Search
CPC .......................... C23C 14/042; C23C 16/042
See application file for complete search history.

(56) References Cited

U.S. PATENT DOCUMENTS

| 8,881,676 B2 | 11/2014 | Hong |
| 2003/0118255 A1* | 6/2003 | Miller ............... B65D 83/7575 383/66 |
| 2014/0377903 A1 | 12/2014 | Takeda et al. |
| 2016/0047030 A1 | 2/2016 | Obata et al. |
| 2016/0260935 A1 | 9/2016 | Lee |

(Continued)

FOREIGN PATENT DOCUMENTS

| CN | 102760842 A | 10/2012 |
| CN | 104372291 | 2/2015 |

(Continued)

OTHER PUBLICATIONS

Extended European Search Report corresponding to Application No./Patent No. 21212948.0, dated Sep. 12, 2022.

(Continued)

*Primary Examiner* — Aiden Lee
(74) *Attorney, Agent, or Firm* — Lerner David LLP

(57) ABSTRACT

A deposition apparatus includes a chamber, a deposition source disposed in the chamber, a mask assembly, and a base substrate disposed on the mask assembly. The mask assembly includes a frame including frame openings, a mask disposed on the frame and including deposition holes, and a welding stick disposed on the mask. A welding groove is disposed along an edge of the frame and has a depth in the thickness direction of the frame. The welding stick overlaps the welding groove.

13 Claims, 12 Drawing Sheets

(56) References Cited

U.S. PATENT DOCUMENTS

| | | | |
|---|---|---|---|
| 2016/0348227 A1 | 12/2016 | Wu et al. | |
| 2018/0083193 A1* | 3/2018 | Kim | H10K 71/164 |
| 2019/0084088 A1* | 3/2019 | Takei | C23C 14/048 |
| 2019/0211436 A1* | 7/2019 | Nishida | H10K 71/00 |
| 2020/0291510 A1* | 9/2020 | Okamoto | H10K 71/166 |
| 2021/0060700 A1* | 3/2021 | Okamoto | C23C 14/04 |
| 2021/0172047 A1* | 6/2021 | Yang | G03F 1/38 |
| 2022/0081753 A1* | 3/2022 | Son | C23C 14/042 |

FOREIGN PATENT DOCUMENTS

| | | |
|---|---|---|
| CN | 205662586 | 10/2016 |
| CN | 107815642 | 3/2018 |
| CN | 109423604 A | 3/2019 |
| CN | 114164398 A | 3/2022 |
| EP | 3 967 788 | 3/2022 |
| JP | 5804457 | 11/2015 |
| JP | 2018-90910 | 6/2018 |
| JP | 6359788 | 7/2018 |
| KR | 10-0696553 | 3/2007 |
| KR | 10-2018-0038093 | 4/2018 |
| KR | 10-2019-0092840 | 8/2019 |

OTHER PUBLICATIONS

Partial European search report for European Patent Application or Patent No. 21212948.0 dated May 4, 2022.
Search Report dated Jul. 3, 25 from the Office Action for Chinese Application No. 202111511396.2, 1 page.

* cited by examiner

METHOD FOR MANUFACTURING MASK AND DEPOSITION APPARATUS INCLUDING MASK

CROSS-REFERENCE TO RELATED APPLICATIONS

This application claims priority to and benefits of Korean Patent Application No. 10-2020-0170132 under 35 U.S.C. § 119, filed on Dec. 8, 2020 in the Korean Intellectual Property Office, the entire contents of which are incorporated herein by reference.

BACKGROUND

The disclosure herein relates to a method for manufacturing a mask and a deposition apparatus including the mask. The method for manufacturing a mask may have an improved opening rate, and a deposition apparatus including the mask.

In general, a light emitting display device includes a light emitting device disposed at each pixel. The light emitting device includes a light emitting layer disposed between spaced electrodes. The light emitting layers contained in the pixels may be distinguished into groups.

A mask assembly is used to deposit the groups of light emitting layers onto a working substrate. The mask assembly includes a frame, a support, and a mask. The working substrate may be disposed on the mask, and a light emitting material may be deposited on the working substrate to provide patterned light emitting layers.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a method for manufacturing a mask.

An embodiment provides a deposition apparatus which may include a chamber; a deposition source disposed in the chamber; a mask assembly, and a base substrate disposed on the mask assembly. The mask assembly may include a frame including frame openings, a mask disposed on the frame, the mask including deposition holes, and a welding stick disposed on the mask. A welding groove may be disposed along an edge of the frame, the welding groove having a depth in the thickness direction of the frame. The welding stick may overlap the welding groove.

In an embodiment, the mask may include a base layer including a first surface contacting the base substrate and a second surface opposite to the first surface, the base layer including first openings, and a metal layer disposed on the second surface of the base layer, the metal layer including second openings. The first openings and second openings may include at least one first opening and at least one second opening which overlap each other to form a deposition hole disposed in the mask. A width of the at least one first opening may be less than a width of the at least one second opening.

In an embodiment, a portion of the second surface may be exposed from the metal layer by the at least one second opening.

In an embodiment, the base layer may have a first side surface which defines the at least one first opening and may be inclined from the first surface of the base layer, and the metal layer may have a second side surface which defines the at least one second opening and may be inclined from the second surface of the base layer in a same direction as the first side surface of the base layer.

In an embodiment, each of the first openings and the second openings may have a trapezoidal shape in a cross-sectional view.

In an embodiment, the welding stick may be welded to the frame. The mask may be disposed between the frame and the welding stick. The welding stick may be disposed in the welding groove such that the welding stick and the first surface of the base layer provide a flat surface on which the base substrate is disposed.

In an embodiment, the mask may have a portion that overlaps the welding stick and may be disposed in the welding groove.

In an embodiment, the mask may include an inorganic layer disposed between the base layer and the metal layer. The inorganic layer may include third openings.

In an embodiment, the first openings, the second openings, and the third openings include at least one first opening, at least one second opening, and at least one third opening which overlap each other to form a deposition hole disposed in the mask. A width of the at least one third opening may be greater than the width of the at least one first opening and less than the width of the at least one second opening.

In an embodiment, the deposition apparatus may further include a magnetic plate disposed above the mask assembly to provide a magnetic force to the mask.

In an embodiment, the frame may include first partition parts extending in a first direction and second partition parts extending in a second direction intersecting the first direction. The frame openings may be divided by the first partition parts and the second partition parts.

In an embodiment, the deposition source may include an organic material, and the deposition source may evaporate the organic material and inject the evaporated organic material to the frame openings.

In an embodiment, the base layer may include an organic material, and the metal layer may include at least one of aluminum, copper, and transparent conductive oxide.

In an embodiment, the mask may be provided in plural. The plurality of masks may be arranged in a first direction, and may extend in a second direction intersecting the first direction. The welding stick may extend in the first direction to overlap an end of each of the masks.

In an embodiment, a method for manufacturing a mask may include providing a working substrate on which an initial base layer and an initial metal layer are formed, the initial base layer comprising an organic material, and the initial metal layer including metal and disposed on the initial base layer, forming an initial opening by patterning the initial metal layer through a first photolithography process, forming a base layer including a first opening that overlaps the initial opening by etching the initial base layer; and forming a metal layer including a second opening that overlaps the first opening by patterning the initial metal layer adjacent to the initial opening through a second photolithography process. A width of the first opening may be greater than a width of the initial opening and less than a width of the second opening.

In an embodiment, the base layer may include a first surface and a second surface opposite to the first surface.

The metal layer may be formed on the second surface of the base layer. A portion of the base layer adjacent to the first opening may be exposed from the metal layer by the second opening.

In an embodiment, the base layer may have a first side surface which defines the first opening and may be inclined from the first surface of the base layer. The metal layer may have a second side surface which defines the second opening and may be inclined from the second surface of the base layer in a same direction as the first side surface.

In an embodiment, the first side surface may be a curved surface.

In an embodiment, the base layer may include an organic material, and the metal layer may include at least one of aluminum, copper, and transparent conductive oxide.

In an embodiment, the first opening and the second opening may form a deposition hole. The deposition hole may be provided in plural. The plurality of deposition holes may have different shapes from each other.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
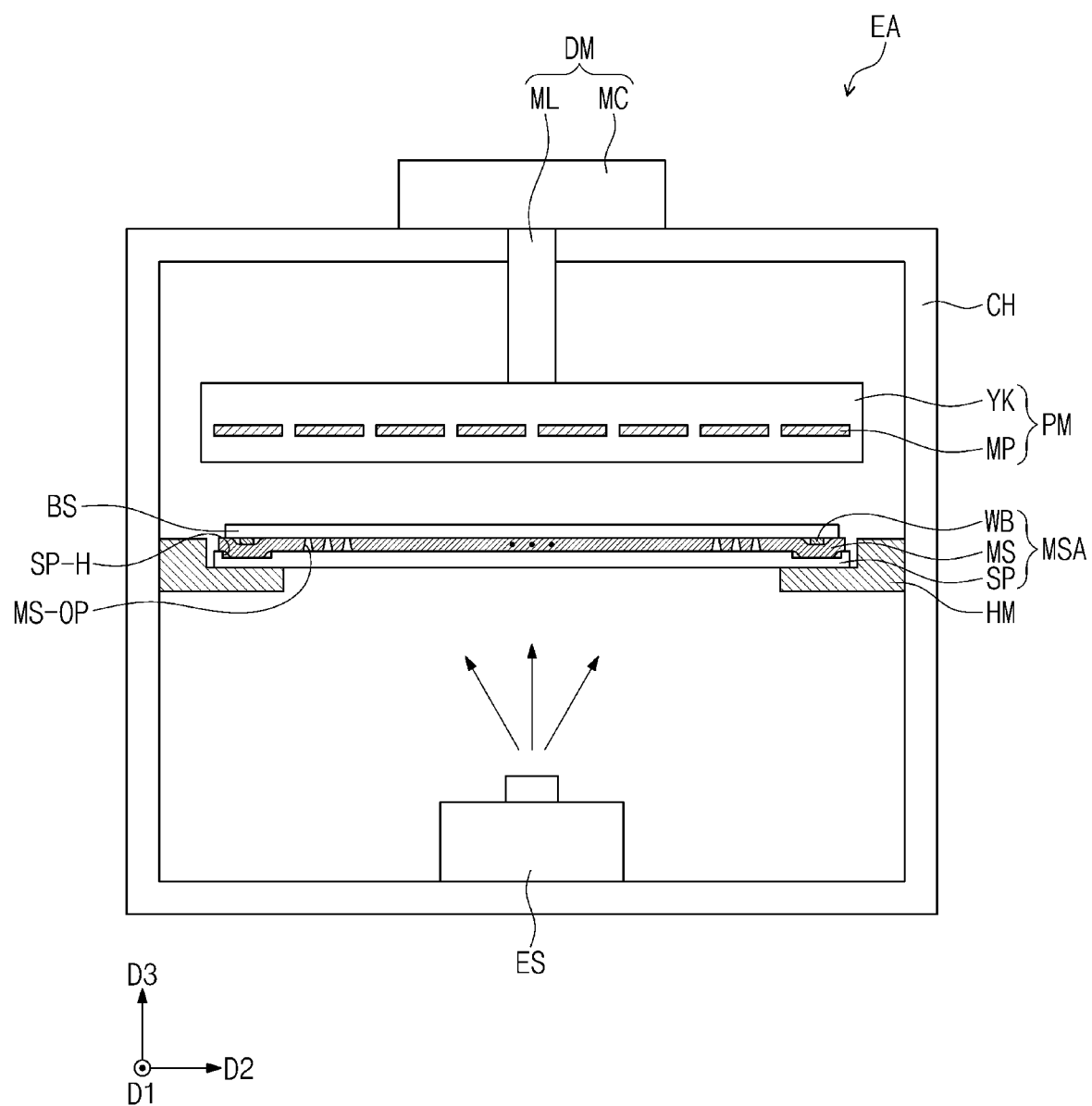
FIG. 1 is a schematic plan view illustrating a deposition apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will also be understood that when one component (or region, layer, portion) is referred to as being 'on,' 'connected to,' or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under," "below," "above,' "upper," and the like are used for explaining relation association of components illustrated in the drawings. The terms may be a relative concept and described based on directions expressed in the drawings.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component, or a combination thereof, but does not exclude other properties, fixed numbers, steps, operations, elements, components, or combinations thereof. Hereinafter, embodiments will be described with reference to the accompanying drawings.

Figure 2A:
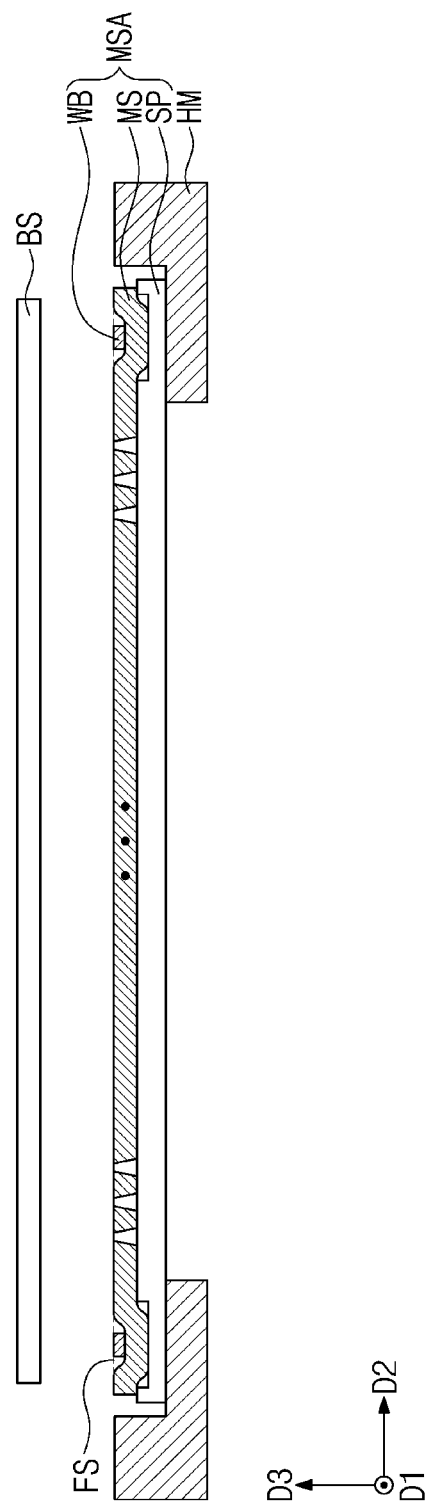
FIG. 2A is a schematic plan view illustrating a mask assembly according to an embodiment.
Figure 2B:
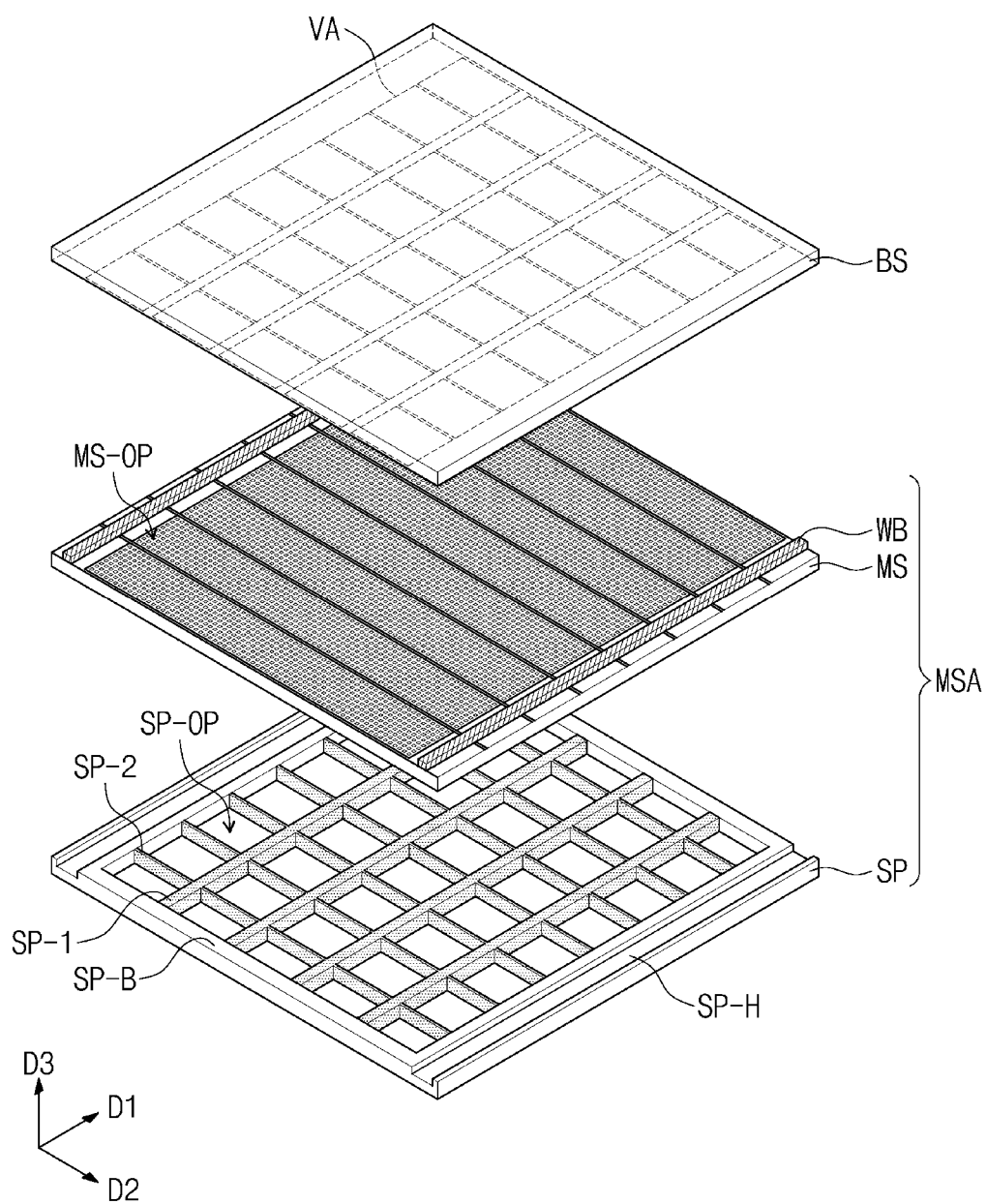
FIG. 2B is a schematic exploded perspective view illustrating the mask assembly according to an embodiment.
Figure 3:
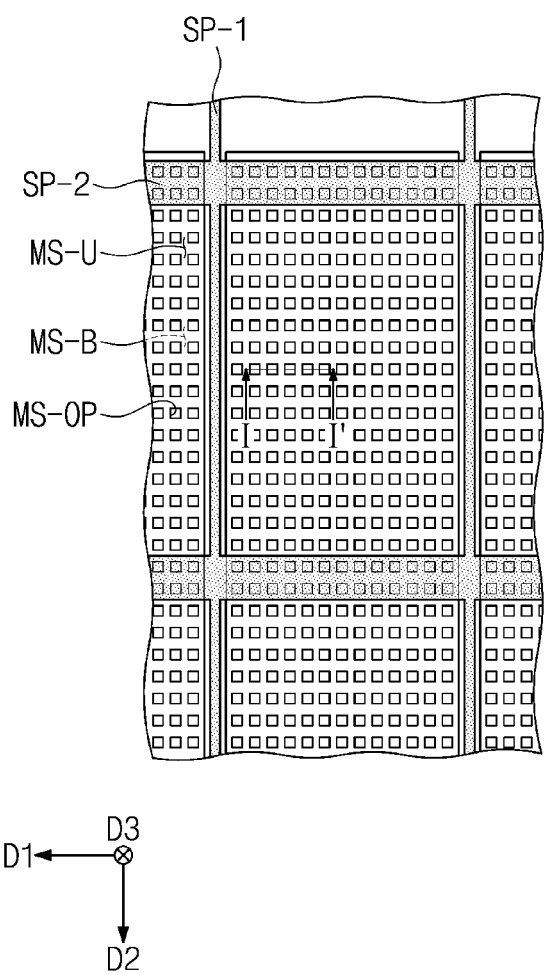
FIG. 3 is a schematic plan view illustrating a mask according to an embodiment.
Figure 4:
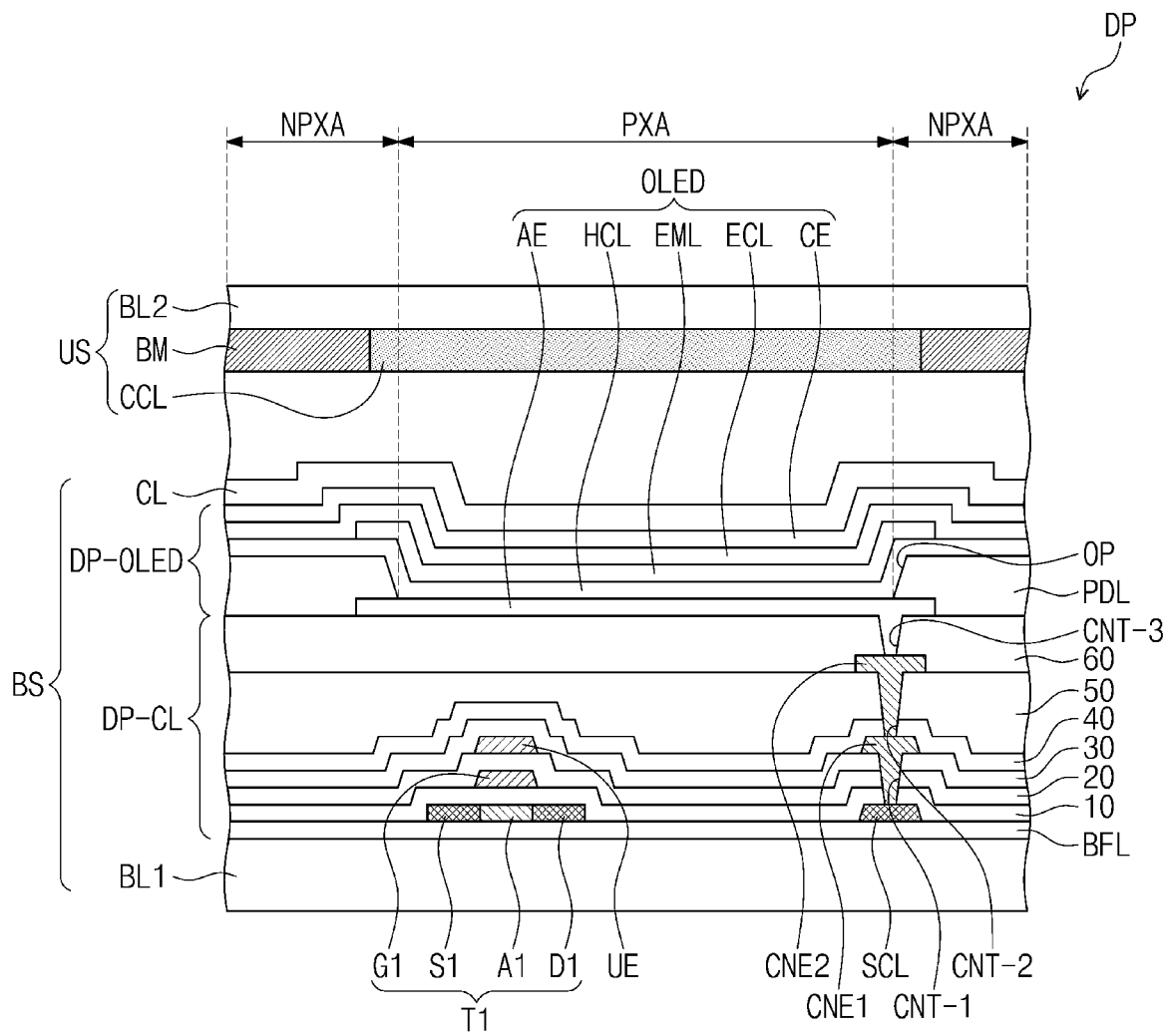
FIG. 4 is a schematic cross-sectional view illustrating a display panel according to an embodiment.

FIG. 1 is a schematic plan view illustrating a deposition apparatus according to an embodiment. FIG. 2A is a schematic plan view illustrating a mask assembly according to an embodiment. FIG. 2B is a schematic exploded perspective view illustrating the mask assembly according to an embodiment. FIG. 3 is a schematic plan view illustrating a mask according to an embodiment. FIG. 4 is a schematic cross-sectional view illustrating a display panel according to an embodiment.

Referring to FIGS. 1 to 2B, a deposition apparatus EA according to an embodiment may include a chamber CH, a deposition source ES, a seat part HM, a mask assembly MSA, a base substrate BS, a pressing part PM, and a transfer part DM. The deposition apparatus EA may deposit an organic material or a conductive material on the base substrate BS.

The chamber CH may provide an inner space in which a deposition process may be performed. The deposition source ES, the seat part HM, the mask assembly MSA, the base substrate BS, the pressing part PM, and a transfer rod ML of the transfer part DM may be disposed in the inner space of the chamber CH.

The deposition source ES may provide a deposition material to the base substrate BS. For example, the deposition source ES may evaporate a deposition material such as an organic material or a conductive material toward the mask MS. Here, the deposition material may pass through the mask assembly MSA and be deposited to the base substrate BS. Here, the deposition source ES may be realized by heating and evaporating the deposition material with a high temperature.

Although not shown, the deposition apparatus EA may further include a transfer unit for moving the deposition source ES in a horizontal direction D1 and D2 or a vertical direction D3.

The seat part HM may be disposed on a sidewall of the chamber CH to support the mask assembly MSA. However, the embodiment is not limited by the shape, position, and number of the seat part HM as long as the seat part HM supports the mask assembly MSA.

The mask assembly MSA may be supported by the seat part HM. The mask assembly MSA may include a frame SP, a mask MS, and welding sticks WB.

The frame SP may be seated on the seat part HM. The frame SP may be seated on the seat part HM to support the mask MS. The frame SP may be disposed below the mask MS to prevent a deflection (or sagging) phenomenon caused by a load of the mask MS.

The frame SP according to the embodiment may include a body part SP-B, a first partition part SP-1, and a second partition part SP-2. The body part SP-B may have a rectangular frame extending in a first direction D1 and a second direction D2.

There may be multiple first partition parts SP-1 provided and each first partition part SP-1 may extend in the first direction D1. The first partition parts SP-1 may be arranged in the second direction D2 and connected to the body part SP-B.

There may be multiple second partition parts SP-2 provided and each second partition part SP-2 may extend in the second direction D2. The second partition parts SP-2 may be arranged in the first direction D1 and connected to the body part SP-B.

A space provided as the first partition parts SP-1 and the second partition parts SP-2 intersect with each other is defined as a frame opening SP-OP. The frame opening SP-OP may correspond to one deposition area VA of the base substrate BS. The deposition area VA, on which a deposition material is deposited, in the base substrate BS may provide one display cell unit.

In the frame SP according to an embodiment, a welding groove SP-H obtained by removing a portion of the frame SP along an edge of the frame SP in a third direction D3 may be defined. The welding groove SP-H may overlap a welding stick WB. The welding groove SP-H may be defined in the body part SP-B of the frame SP.

In this embodiment, the welding groove SP-H may be a rectangular groove extending in the first direction D1. However, the embodiment is not limited to the cross-sectional shape of the welding groove SP-H. For example, the cross-sectional shape of the welding groove SP-H may be a circular shape, an oval shape, or a polygonal shape.

The welding groove SP-H may be disposed at both ends in the second direction D2 and each extend in the first direction D1. However, the embodiment is not limited to the shape and number of the welding groove SP-H. For example, the welding grooves SP-H may correspond to the shape and number of the welding sticks WB.

As illustrated in FIG. 2A, the welding sticks WB may be welded and coupled to the frame SP with the base substrate BS disposed between the welding sticks WB. Here, the welding stick WB and the mask MS overlapping the welding stick WB may be accommodated in the welding groove SP-H. The mask MS according to an embodiment may include a flexible material.

Although the welding sticks WB are disposed on the mask MS and welded to the frame SP with the base substrate BS disposed between the welding sticks WB, as the welding grooves SP-H provide a space in which the welding sticks WB and the mask MS are accommodated, a surface of the mask MS and a surface of the welding stick WB may provide a flat surface FS. Thus, as the base substrate BS is stably seated on the frame SP, a uniform deposition process may be performed on the base substrate BS.

The welding stick WB may be disposed on the mask MS. The welding stick WB may overlap a plurality of masks, and may be welded to the frame SP with the masks disposed between the frame SP and the welding stick WB, and disposed to overlap the welding groove SP-H. The material, shape, and number of the welding sticks WB may be modified as required for welding, and thus, the shape and position of the welding groove SP-H may be also modified to accommodate the welding stick WB.

Multiple masks MS may be provided, and the masks MS may each extend in the second direction D2 and be arranged in the first direction D1. Deposition holes MS-OP may be defined in each of the masks MS. The deposition material provided from the deposition source ES may be provided onto a surface of the base substrate BS through the deposition holes MS-OP.

The mask MS according to an embodiment may include a flexible material. The mask MS may include multiple layers. One layer of the mask MS may include an organic material, and another layer may include metal. Thus, the mask MS may be accommodated in the welding groove SP-H together with the welding stick WB according to the flexibility of the mask MS. A detailed description of a layer structure of the mask MS will be described later.

Referring to FIG. 3, the mask MS may include a top surface MS-B contacting the base substrate BS and a rear surface MS-U contacting the frame SP. The deposition material may not pass through the deposition holes MS-OP defined in an area overlapping the partition parts SP-1 and SP-2 of the frame SP.

Although the deposition holes MS-OP are illustrated to be arranged in a square shape as an example in FIG. 3, the embodiment is not limited thereto. For example, the deposition holes MS-OP may have the same shape with the same size or may each have different shapes with different areas.

The base substrate BS may be a mother substrate on to which the deposition material is deposited. The base substrate BS may include deposition areas VA. The deposition areas VA may be arranged in a matrix form along the first direction D1 and the second direction D2. The deposition areas VA may be divided by the partition parts SP1 and SP2 of the frame SP. The deposition areas VA may be cut into an individual cells in a subsequent process.

Referring to FIG. 1 again, the pressing part PM may include a magnetic plate MP and a support plate YK. Although not shown, the pressing part PM may further include a cooling plate disposed between the base substrate BS and the support plate YK.

The cooling plate (not shown) may be disposed between the base substrate BS and the support plate YK. The cooling plate may cool the base substrate BS or the mask MS to prevent the base substrate BS or the mask MS from being overheated during the deposition process. Thus, deformation of the base substrate BS may be prevented. A cooling line to which a coolant or cooled air is injected may be provided in the cooling plate.

The magnetic plate MP may be disposed in the support plate YK. However, the embodiment is not limited by the position, shape, and number of the magnetic plates MP as long as the magnetic plate MP is disposed above the mask MS and can couple the mask MS and the base substrate BS together with a magnetic force.

The magnetic plate MP provides a magnetic force in a state in which the base substrate BS closely contacts the mask MS and pulls the mask MS which contains metal with an attractive force. Thus, the coupling force between the base substrate BS and the mask MS may be increased.

The magnetic plate MP may prevent a lifting phenomenon generated due to difference between curvatures of the base substrate BS and the mask MS and thus prevent deposition defects such as the shadowing phenomenon. The magnetic plate MP may be comprised of either a permanent magnet or an electromagnet.

The support plate YK may accommodate the magnetic plate MP. The support plate YK may be coupled to the transfer part DM to allow the magnetic plate MP to closely contact the base substrate BS or separate the magnetic plate MP from the base substrate BS.

The transfer part DM is connected to the pressing part PM. The transfer part DM may include a transfer rod ML and a transfer body MC. The transfer body MC may transfer the pressing part PM by means of the transfer rod ML in the third direction D3, i.e., a vertical direction.

For example, the transfer body MC may be disposed outside the chamber CH. The transfer body MC may be implemented as either a cylinder or a motor. For example, when the transfer body MC is a cylinder, the transfer rod ML may be a piston. When the transfer body MC is a motor, the transfer rod ML may be a ball screw shaft that is movable in the vertical direction by rotating the motor. However, the embodiment is not limited thereto. For example, the transfer part DM may include a range of devices that can transfer the pressing part PM.

FIG. 4 is a schematic cross-sectional view illustrating a display panel according to an embodiment. Some of components of a display panel DP in FIG. 4 may be provided through the deposition apparatus EA described in FIGS. 1 to 3. For example, the base substrate BS described in FIGS. 1 to 3 may be a component contained in a base substrate BS of the display panel DP.

A gradation display layer of the display panel DP according to an embodiment may include an organic light emitting layer. Thus, the display panel DP may be an organic light emitting display panel.

The organic light emitting display panel includes a base substrate BS and an encapsulation substrate US. The base substrate BS includes a first substrate BL1, a circuit device layer DP-CL disposed on the first substrate BL1, a display device layer DP-OLED disposed on the circuit device layer DP-CL, and a cover layer CL disposed on the display device layer DP-OLED. The encapsulation substrate US may include a second substrate BL2, a black matrix layer BM disposed on the second substrate BL2, and a color control layer CCL.

The circuit device layer DP-CL may include insulation layers, a semiconductor pattern, a conductive pattern, and a signal line. The insulation layer, the semiconductor layer, and the conductive layer are provided on the first substrate BL1 by a method such as coating and deposition. Thereafter, the insulation layer, the semiconductor layer, and the conductive layer may be selectively patterned by a photolithography method. By using the above-described method, the semiconductor pattern, the conductive pattern, and the signal line, which are contained in the circuit device layer DP-CL and the display device layer DP-OLED, are provided.

The first substrate BL1 may include a synthetic resin film. Besides, the first substrate BL1 may include a glass substrate, a metal substrate, or an organic/inorganic composite substrate.

A buffer layer BFL is disposed on the first substrate BL1. The buffer layer BFL enhances a coupling force between the first substrate BL1 and the semiconductor pattern. The buffer layer BFL may include a silicon oxide layer and a silicon nitride layer. The silicon oxide layer and the silicon nitride layer may be alternately laminated with each other.

A semiconductor pattern is disposed on the buffer layer BFL. The semiconductor pattern may include polysilicon. However, the embodiment is not limited thereto. For example, the semiconductor pattern may include amorphous silicon or metal oxide.

The semiconductor pattern may include a doped area and a non-doped area. The doped area may be doped with a n-type dopant or a p-type dopant. A p-type transistor includes a doped area that is doped with the p-type dopant.

The doped area has a conductivity greater than that of a non-doped area and substantially serves as an electrode or a signal line. The non-doped area substantially corresponds to an active (or a channel) of the transistor. A portion of the semiconductor pattern may be the active of the transistor, another portion may be a source or a drain of the transistor, and another portion may be a connection electrode or a connection signal line.

A transistor T1 is disposed on the buffer layer BFL. A source S1, an active A1 and a drain D1 of the transistor T1 may be provided from the semiconductor pattern. FIG. 4 illustrates a portion of a connection signal line SCL provided from the semiconductor pattern. The connection signal line SCL may be connected to the drain D1 of the transistor T1 on a plane.

A first insulation layer 10 to a sixth insulation layer 60 are disposed on the buffer layer BFL. Each of the first insulation layer 10 to the sixth insulation layer 60 may be an inorganic layer or an organic layer. A gate G1 is disposed on the first insulation layer 10. An upper electrode UE may be disposed on the second insulation layer 20. A first connection electrode CNE1 may be disposed on the third insulation layer 30.

The first connection electrode CNE1 may be connected to the connection signal line SCL through a contact hole CNT-1 passing through the first to third insulation layers 10 to 30. A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A light emitting device OLED is disposed on the sixth insulation layer 60. A first electrode AE is disposed on the sixth insulation layer 60. The first electrode AE is connected to the second connection electrode CNE2 through a contact hole CNT-3 passing through the sixth insulation layer 60.

The display device layer DP-OLED includes the light emitting device OLED and a pixel defining layer PDL. For example, the pixel defining layer PDL may be an organic layer. The light emitting device OLED includes a first electrode AE, a hole control layer HCL, a light emitting layer EML, an electron control layer ECL, and a second electrode CE.

The pixel defining layer PDL is disposed on the sixth insulation layer 60. A display opening OP is defined in a pixel defining layer PDL. The display opening OP exposes at least a portion of the first electrode AE. In an embodiment, the pixel defining layer PDL may have a black color. The pixel defining layer PDL may include a black coloring agent. The pixel defining layer PDL may include a black dye and a black pigment mixed in a base resin.

The display panel DP may include a light emitting area PXA and a non-light emitting area NPXA disposed adjacent to the light emitting area PXA. Substantially, the light emitting area PXA may be defined in correspondence to an area of the first electrode AE exposed by the display opening OP.

The hole control layer HCL may be disposed on the light emitting area PXA and the non-light emitting area NPXA in common. The hole control layer HCL may include a hole transport layer and further include a hole injection layer. The light emitting layer EML is disposed on the hole control layer HCL. The light emitting layer EML may be disposed on an area corresponding to the display opening OP.

The electron control layer ECL is disposed on the light emitting layer EML. The electron control layer ECL may include an electron transport layer and further include an electron injection layer. The second electrode CE is disposed on the electron control layer ECL.

The cover layer CL is disposed on the second electrode CE. The cover layer CL may include a plurality of thin-films. In this embodiment, the cover layer CL may include a capping layer and a thin-film encapsulation layer.

The second substrate BL2 is spaced apart from the cover layer CL. The second substrate BL2 may be one of a glass substrate, a plastic substrate, or a substrate containing polyimide.

The color control layer CCL may transmit first color light or covert the first color light into second color light or third color light according to a color of light. The color control layer CCL may include a quantum-dot. Here, the first color light may be blue light.

The black matrix layer BM may overlap the non-light emitting area NPXA. The black matrix layer BM may have a black color. Although the black matrix layer BM may include a material absorbing light, the embodiment is not limited thereto.

The deposition apparatus EA according to an embodiment may be used to provide the light emitting layer EML containing an organic material among components contained in the light emitting device OLED. However, the embodiment is not limited thereto. For example, a component provided through the deposition process among components provided on the base layers BL1 and BL2 of the display panel DP may be provided by the deposition apparatus EA according to an embodiment.

Figure 5:
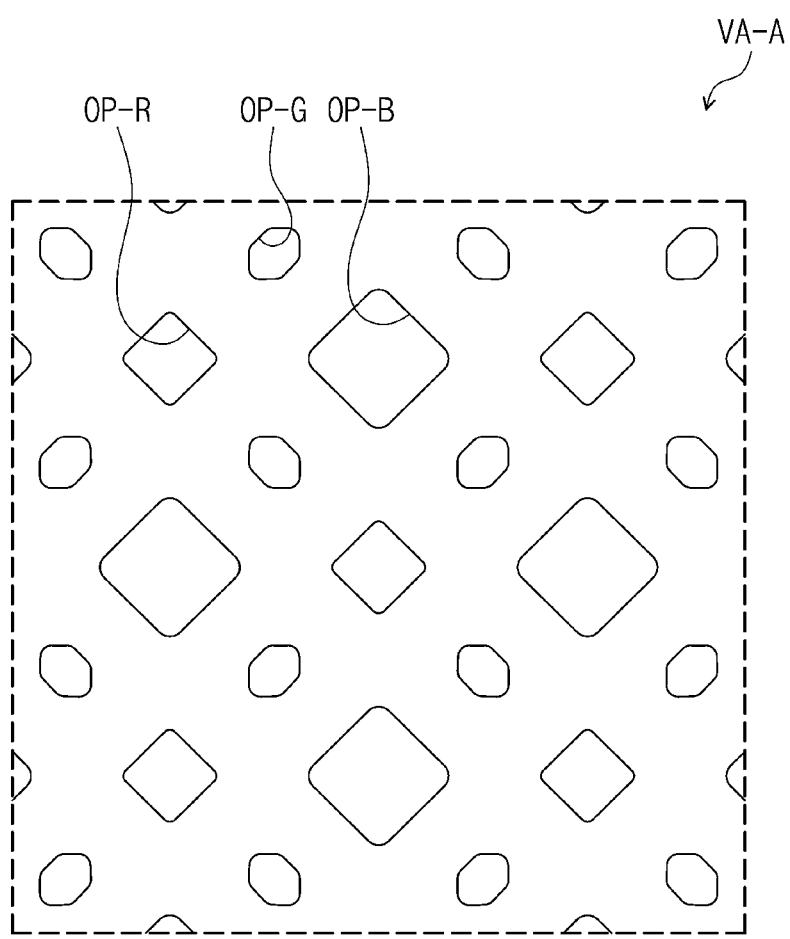
FIG. 5 is a schematic plan view illustrating a deposition area according to an embodiment.

FIG. 5 is a schematic plan view illustrating a deposition area VA-A according to an embodiment. Hereinafter, a method for forming the light emitting layer EML (refer to FIG. 4) in each of display openings OP-R, OP-G, and OP-B of the pixel defining layer PDL in FIG. 4 will be described.

As illustrated in FIG. 5, three kinds of display openings OP-R, OP-G, and OP-B may be formed in the pixel defining layer PDL. The three kinds of light emitting openings OP-G, OP-R, and OP-B may include a first display opening OP-G, a second display opening OP-R, and a third display opening OP-B, which are distinguished according to areas thereof.

Each of the first display opening OP-G, the second display opening OP-R, and the third display opening OP-B may have an area that is proportional to a light emitting area (or an area of the first electrode) of a corresponding pixel. In this embodiment, the first display opening OP-G may be a pixel providing a green color, the second display opening OP-R may be a pixel providing a red color, and the third display opening OP-B may be a pixel providing a blue color.

Different masks may be used to form a light emitting layer of the green light emitting device, a light emitting layer of the red light emitting device, and a light emitting layer of the blue light emitting device in the first display opening OP-G, the second display opening OP-R, and the third display opening OP-B, respectively.

Figure 6:
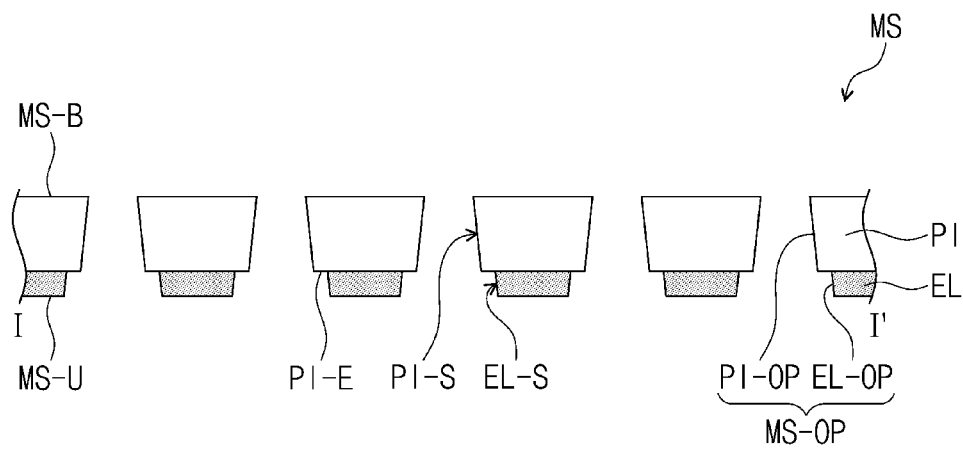
FIG. 6 is a schematic cross-sectional view taken along line I-I' of FIG. 3.
Figure 6:
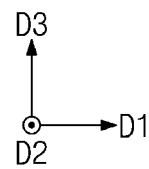

FIG. 6 is a schematic cross-sectional view taken along line I-I' of FIG. 3. The same or similar components as those in FIGS. 1 to 5 will be designated by the same or similar reference numerals, respectively, and previously described components will not be repeated.

The mask MS according to an embodiment may include a top surface MS-B contacting the base substrate BS (refer to FIG. 1) and a rear surface MS-U opposite to the top surface MS-B and contacting the frame SP (refer to FIG. 1). The mask MS may include a base layer PI and a metal layer EL.

A first opening PI-OP may be defined in the base layer PI. The first opening PI-OP may be formed by a first side surface PI-S exposed by passing through the base layer PI in the third direction D3. The base layer PI may include a first surface contacting the base substrate BS and a second surface opposite to the first surface and on which the metal layer is disposed. The first surface may be substantially provided as the top surface MS-B of the mask MS. The first side surface PI-S may be inclined from the first surface. Multiple first openings PI-OP may be provided.

In this embodiment, the base layer PI may include an organic material. For example, the base layer PI may include at least one of polyimide, polycarbonate, polyethylene naphthalene (PEN), and polyethyleneterephthalate (PETE). Thus, the base layer PI may comprise a flexible material.

A second opening EL-OP may be defined in the metal layer EL. The second opening EL-OP may be formed by a second side surface EL-S exposed by passing through the metal layer EL in the third direction D3. The second side surface EL-S may be inclined from the second surface of the base layer PI on a cross-section. An inclined direction of the second side surface EL-S may be the same direction as that of the first side surface PI-S from the first surface. The second opening EL-OP may be provided in plurality.

In this embodiment, the metal layer EL may include metal. For example, the metal layer EL may include at least one of aluminum (Al), copper (Cu), and a transparent conductive oxide. Thus, the metal layer EL may be coupled with the magnetic plate MP.

A portion PI-E of the second surface of the base layer PI according to an embodiment may be exposed from the metal layer EL by the second opening EL-OP. This may be formed by removing an additional portion of the metal layer EL while removing a tip portion of the metal layer EL.

The deposition holes MS-OP defined in the mask MS may be defined by a first opening PI-OP and a second opening EL-OP, which may overlap each other in the third direction D3.

According to this embodiment, the first opening PI-OP may have a width less than that of the second opening EL-OP in the first direction D1. Also, each of the first opening PI-OP and the second opening EL-OP may have a trapezoidal shape in the cross-section.

Figure 7:
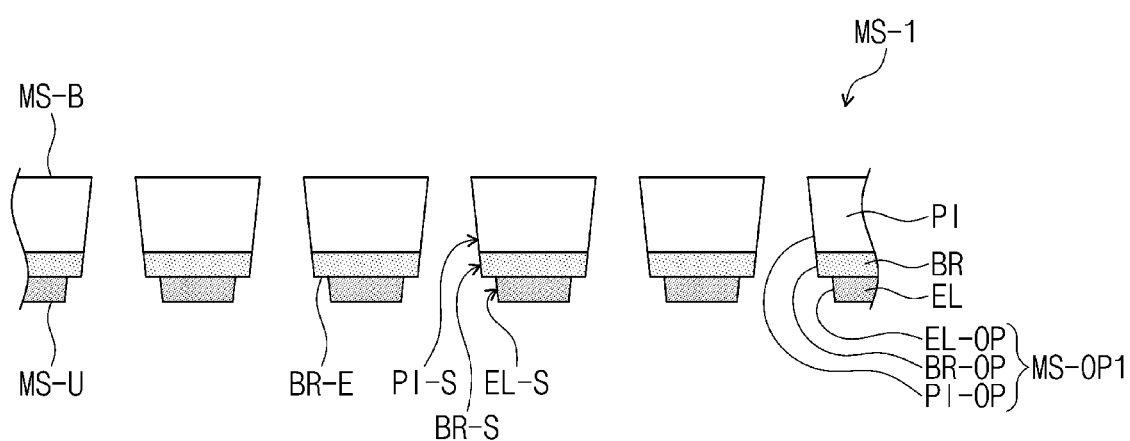
FIG. 7 is a schematic cross-sectional view illustrating a mask according to an embodiment.
Figure 7:
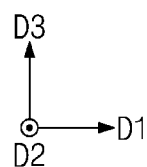

FIG. 7 is a schematic cross-sectional view of a mask according to an embodiment. The same or similar components as those in FIG. 6 will be designated by the same or similar reference numerals, respectively, and their descriptions will not be repeated.

A mask MS-1 according to an embodiment may include a top surface MS-B contacting the base substrate BS (refer to FIG. 1) and a rear surface MS-U opposite to the top surface MS-B and contacting the frame SP (refer to FIG. 1). The mask MS-1 may include a base layer PI, an inorganic layer BR, and a metal layer EL.

A first opening PI-OP may be defined in the base layer PI. The first opening PI-OP may be formed by a first side surface PI-S exposed by passing through the base layer PI in the third direction D3.

In this embodiment, the base layer PI may include an organic material. For example, the base layer PI may include at least one of polyimide, polycarbonate, polyethylene naphthalene (PEN), and polyethyleneterephthalate (PETE). Thus, the base layer PI may have a flexible property.

The inorganic layer BR may be disposed between the base layer PI and the metal layer EL. The inorganic layer BR may be disposed between the base layer PI and the metal layer EL to increase a coupling force between the base layer PI and the metal layer EL. A between opening (or a third opening) BR-OP may be defined in the inorganic layer BR. The between opening BR-OP may be formed by a between side surface BR-S exposed by passing through the inorganic layer BR in the third direction D3. In this embodiment, the between side surface BR-S may be aligned with the first side surface PI-S and inclined from the top surface MS-B.

A second opening EL-OP may be defined in the metal layer EL. The second opening EL-OP may be formed by a second side surface EL-S exposed by passing through the metal layer EL in the third direction D3.

In this embodiment, the metal layer EL may include metal. For example, the metal layer EL may include at least one of aluminum (Al), copper (Cu), and a transparent conductive oxide. Thus, the metal layer EL may be coupled with the magnetic plate MP.

A portion BR-E of the inorganic layer BR according to an embodiment may be exposed from the metal layer EL by the second opening EL-OP.

Deposition holes MS-OP1 defined in the mask MS-1 may be defined by a first opening PI-OP, a between opening (or third opening) BR-OP, and a second opening EL-OP, which overlap each other in the third direction D3.

According to this embodiment, the between opening BR-OP may have a width greater than that of the first opening PI-OP and less than that of the second opening EL-OP in the first direction D1. Also, each of the first opening PI-OP, the between opening BR-OP, and the second opening EL-OP may have a trapezoidal shape on the cross-section.

Figure 8A:
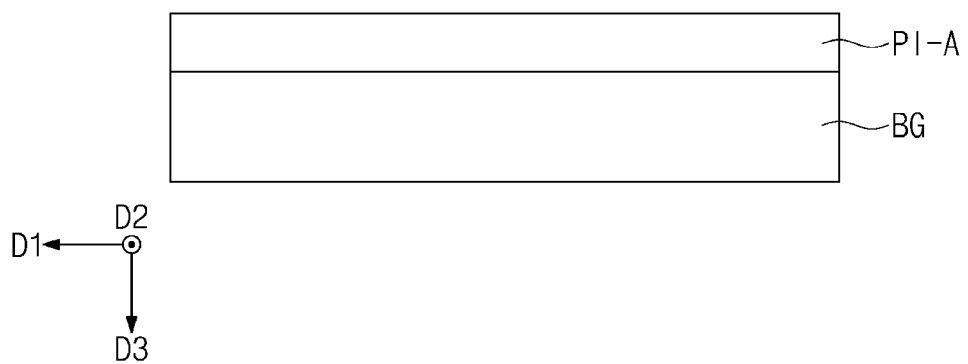
FIG. 8A is a schematic cross-sectional view of a method for manufacturing a mask according to an embodiment.
Figure 8B:
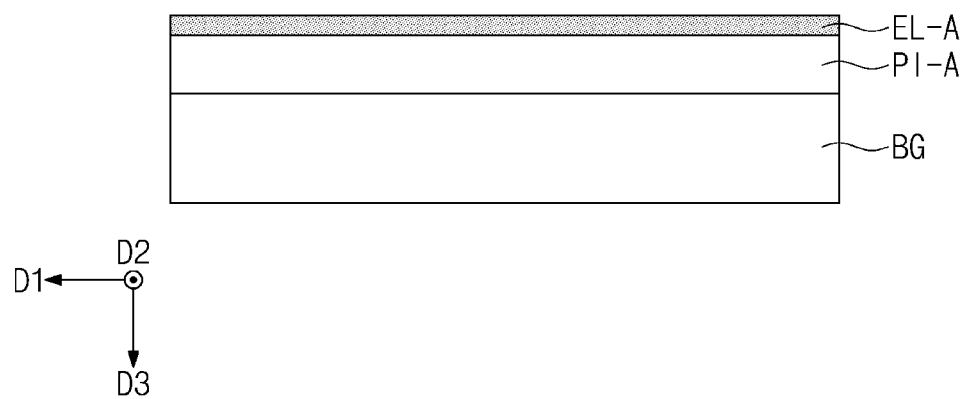
FIG. 8B is a schematic cross-sectional view of the method for manufacturing the mask according to an embodiment.
Figure 8C:
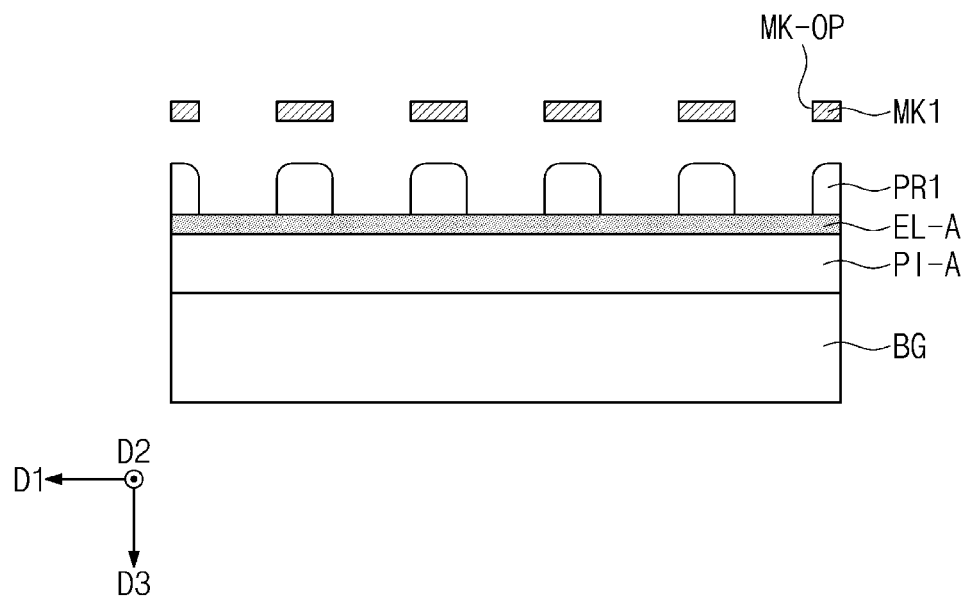
FIG. 8C is a schematic cross-sectional view of the method for manufacturing the mask according to an embodiment.
Figure 8D:
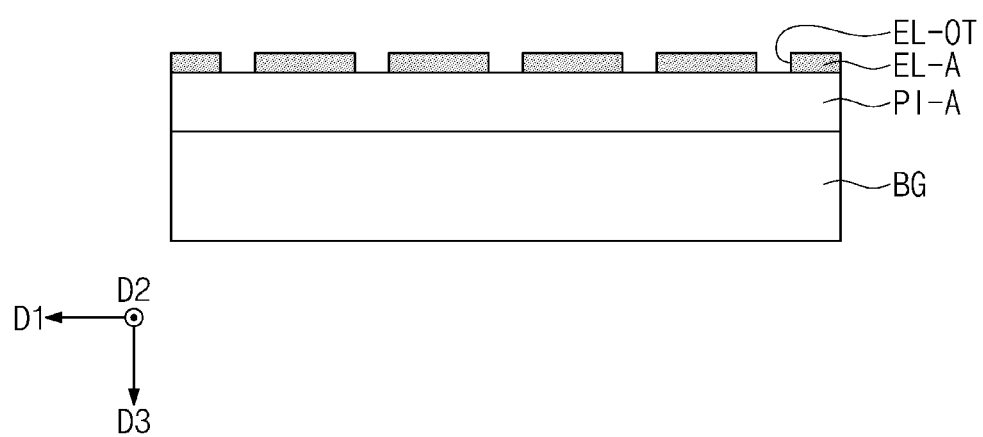
FIG. 8D is a schematic cross-sectional view of the method for manufacturing the mask according to an embodiment.
Figure 8E:
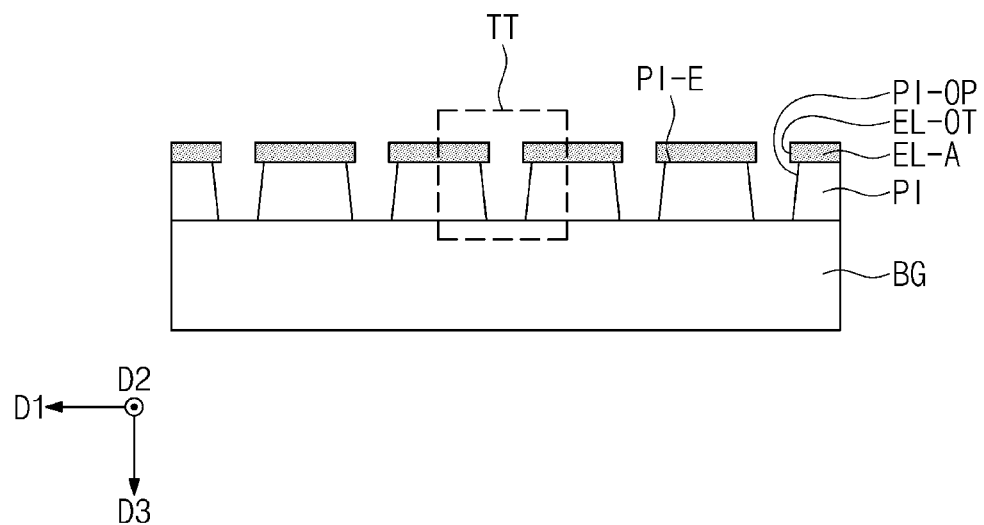
FIG. 8E is a schematic cross-sectional view of the method for manufacturing the mask according to an embodiment.
Figure 9A:
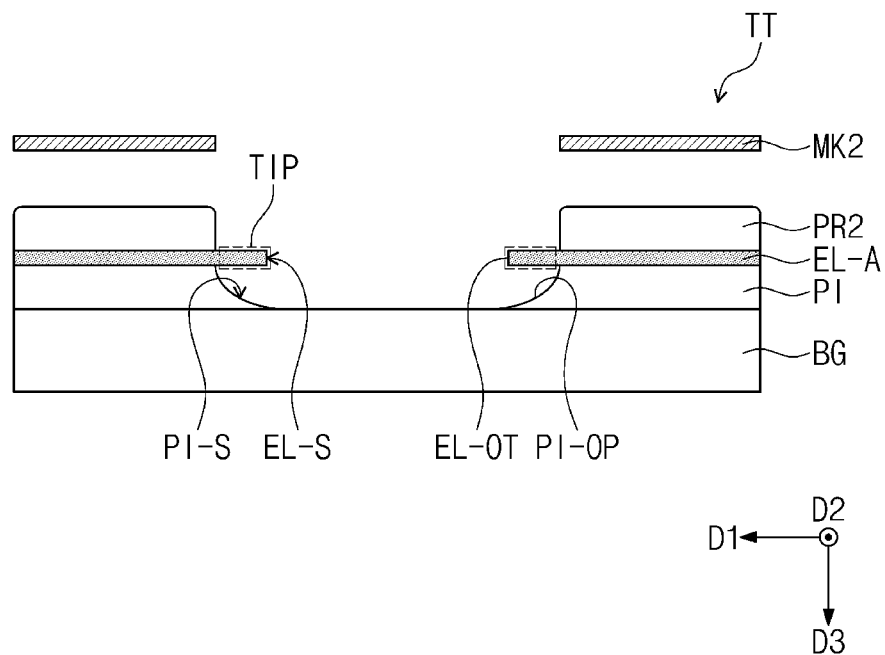
FIG. 9A is a schematic cross-sectional view of the method for manufacturing the mask according to an embodiment.
Figure 9B:
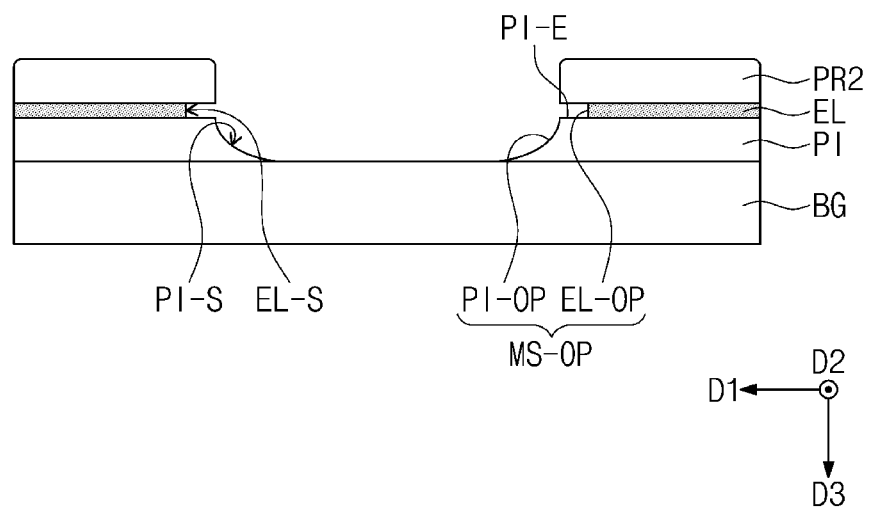
FIG. 9B is a schematic cross-sectional view of the method for manufacturing the mask according to an embodiment.
Figure 9C:
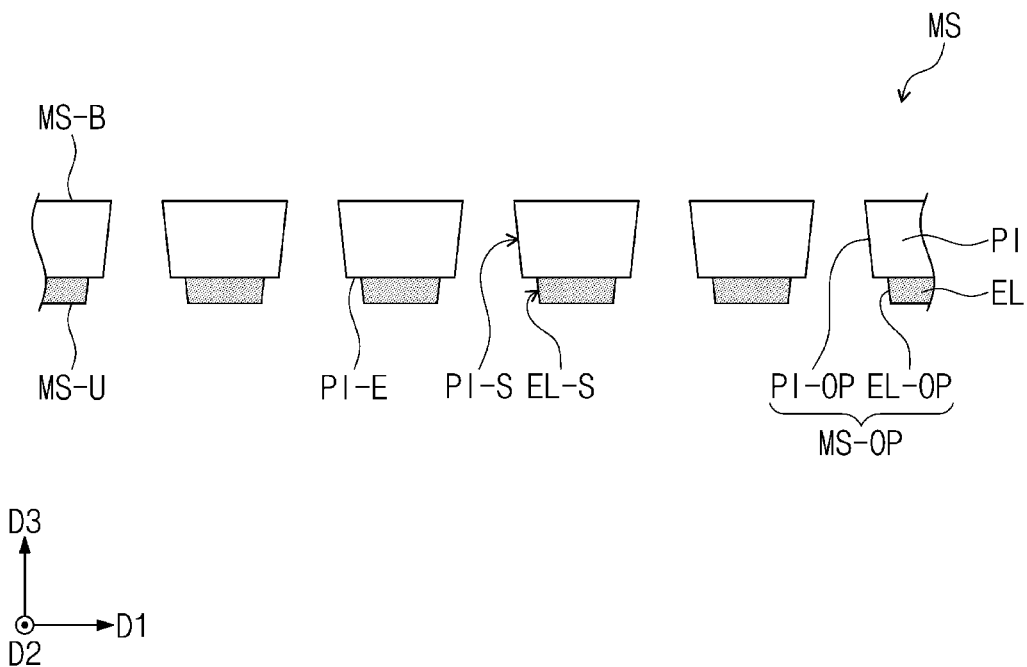
FIG. 9C is a schematic cross-sectional view of the method for manufacturing the mask according to an embodiment.

FIG. 8A is a schematic cross-sectional view of a method for manufacturing a mask according to an embodiment. FIG. 8B is a schematic cross-sectional view of the method for manufacturing the mask according to an embodiment. FIG. 8C is a schematic cross-sectional view of the method for manufacturing the mask according to an embodiment. FIG. 8D is a schematic cross-sectional view of the method for manufacturing the mask according to an embodiment. FIG. 8E is a schematic cross-sectional view of the method for manufacturing the mask according to an embodiment. FIG. 9A is a schematic cross-sectional view of the method for manufacturing the mask according to an embodiment. FIG. 9B is a schematic cross-sectional view of the method for manufacturing the mask according to an embodiment. FIG. 9C is a schematic cross-sectional view of the method for manufacturing the mask according to an embodiment. Hereinafter, the method for manufacturing the mask according to an embodiment will be described with reference to FIGS. 8A to 9C.

The same or similar components as those described in FIGS. 1 to 6 will be designated by the same or similar reference numerals, respectively, and their descriptions will not be repeated.

Referring to FIG. 8A, the method for manufacturing the mask according to an embodiment may include a process of forming an initial base layer PI-A on a working substrate BG. The initial base layer PI-A may be formed by applying an organic material on the working substrate BG.

Thereafter, referring to FIG. 8B, the method for manufacturing the mask according to an embodiment may include a process of forming an initial metal layer EL-A. The initial metal layer EL-A may be formed on the initial base layer PI-A. The initial metal layer EL-A may be formed by applying at least one of aluminum (Al), copper (Cu), and a transparent conductive oxide on the initial base layer PI-A.

Thereafter, referring to FIGS. 8C and 8D, the method for manufacturing the mask according to an embodiment may include a process of forming an initial opening. An initial opening EL-OT may be formed by patterning the initial metal layer EL-A through a first photolithography process. Here, the first photolithography process may form the initial opening EL-OT by exposing, developing, and etching the initial metal layer EL-A through a first photoresist PR1 and a first photo mask MK1 having a photo opening MK-OP.

Thereafter, referring to FIG. 8E, the method for manufacturing the mask according to an embodiment may include a process of forming a base layer in which a first opening is defined by etching the initial base layer.

A first opening PI-OP may be formed by etching the initial base layer PI-A using the initial metal layer EL-A as a mask. Here, the etching method used may be either a wet etch method or a dry etch method.

Due to the etch rate difference in the process of forming the first opening PI-OP in the base layer PI, a side surface of the initial metal layer EL-A defining the initial opening EL-OT may protrude further than a side surface of the base layer PI defining the first opening PI-OP in the first direction D1. Here, the side surface of the initial metal layer EL-A protruding further than the side surface of the base layer PI may be defined as a tip portion. This tip portion may act as an obstruction element when a deposition material is deposited on the base substrate BS. The obstruction may cause a deposition failure known as a shadowing phenomenon.

The method for manufacturing the mask according to an embodiment may further include a process of removing the tip portion of the initial metal layer EL-A.

Referring to FIGS. 9A and 9B, the method for manufacturing the mask according to an embodiment may include a process of forming the metal layer in which a second opening is formed by removing the tip portion of the initial metal layer. The first side surface of PI-OP may be a curved surface.

A second opening EL-OP defined in the metal layer EL may be formed by patterning the initial metal layer EL-A in which the initial opening EL-OT is defined through a second photolithography process. Here, the second photolithography process may form the second opening EL-OP by exposing, developing, and etching the initial metal layer EL-A through a second photoresist PR2 and a second photo mask MK2 having a photo opening overlapping the initial opening EL-OT.

The second opening EL-OP may be formed as the tip portion is removed from the initial metal layer EL-A. The second opening EL-OP may have a width greater than a maximum width of the first opening PI-OP in the first direction D1. The second opening EL-OP and the first opening PI-OP overlapping the second opening EL-OP in the third direction D3 may constitute the deposition hole MS-OP of the mask MS.

Thereafter, referring to FIG. 9C, the mask MS according to an embodiment may be manufactured by removing the mask MK2 from the metal layer EL and removing the working substrate BG from the base layer PI.

The method for manufacturing the mask according to an embodiment may provide the mask manufacturing method having an improved deposition efficiency by adding the process of removing the tip portion.

The welding groove defined in the frame according to the embodiment may provide the space in which the welding stick and the mask are accommodated although the welding stick is disposed on the mask and welded to the frame with the base substrate disposed between the welding sticks, and a surface of the mask and a surface of the welding stick, which contact the base substrate, may provide the flat surface. Thus, as the base substrate is stably seated on the frame, the uniform deposition process may be performed.

Also, the method for manufacturing the mask according to the embodiment may provide the mask manufacturing method having the improved deposition efficiency by adding the process of removing the tip portion.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A deposition apparatus comprising:
a chamber;
a deposition source disposed in the chamber;
a mask assembly comprising:
a frame including frame openings;
a mask disposed on the frame, the mask including deposition holes; and
a welding stick disposed on the mask; and
a base substrate disposed on the mask assembly, wherein the frame comprises:
a body part having a rectangular frame extending in a first direction and a second direction intersecting the first direction; and
the frame openings extending in a third direction perpendicular to a plane formed by the first and second directions,
a welding groove is defined in the body part of the frame extending along the first direction, the welding groove having a depth in the third direction of the frame,
the welding stick overlaps the welding groove with the mask disposed between the welding stick and the welding groove in the third direction, the welding stick extending in the first direction along the welding groove,
an upper surface of the welding stick and a portion, spaced apart from the upper surface of the welding stick, of an upper surface of the mask provide a flat surface on which the base substrate is disposed,
the upper surface of the welding stick and the portion of the upper surface of the mask both contact with the base substrate, and
the mask has a portion disposed in the welding groove.

2. The deposition apparatus of claim 1, wherein the mask comprises:
a base layer comprising a first surface contacting the base substrate and a second surface opposite the first surface, the base layer including first openings; and
a metal layer disposed on the second surface of the base layer, the metal layer including second openings, wherein
the first openings and the second openings include at least one first opening and at least one second opening which overlap each other to form the deposition holes disposed in the mask, and
a width of the at least one first opening is less than a width of the at least one second opening.

3. The deposition apparatus of claim 2, wherein a portion of the second surface is exposed from the metal layer by the at least one second opening.

4. The deposition apparatus of claim 2, wherein
the base layer has a first side surface which defines the at least one first opening and is inclined from the first surface of the base layer, and
the metal layer has a second side surface which defines the at least one second opening and is inclined from the second surface of the base layer in a same direction as the first side surface of the base layer.

5. The deposition apparatus of claim 4, wherein each of the first openings and the second openings has a trapezoidal shape in a cross-sectional view.

6. The deposition apparatus of claim 2, wherein
the mask further comprises an additional layer disposed between the base layer and the metal layer, and
the additional layer includes third openings.

7. The deposition apparatus of claim 6, wherein
the first openings, the second openings, and the third openings include at least one first opening, at least one second opening, and at least one third opening which overlap each other to form the deposition holes disposed in the mask, and
a width of the at least one third opening is greater than the width of the at least one first opening and less than the width of the at least one second opening.

8. The deposition apparatus of claim 2, wherein
the base layer comprises an organic material, and
the metal layer comprises at least one of aluminum, copper, and transparent conductive oxide.

9. The deposition apparatus of claim 1, wherein the portion of the mask disposed in the welding groove overlaps the welding stick.

10. The deposition apparatus of claim 1, further comprising a magnetic plate disposed above the mask assembly to provide a magnetic force to the mask.

11. The deposition apparatus of claim 1, wherein
the frame comprises:
  first partition parts extending in the first direction; and
  second partition parts extending in the second direction, and
the frame openings of the frame are formed by the first partition parts and the second partition parts.

12. The deposition apparatus of claim 1, wherein
the deposition source comprises an organic material, and
the deposition source evaporates the organic material and injects the evaporated organic material to the frame openings.

13. The deposition apparatus of claim 1, wherein
the mask is provided in plural,
the plurality of masks are arranged in the first direction and extend in the second direction, and
the welding stick extends in the first direction to overlap an end of each of the masks.

* * * * *